United States Patent [19]
Roberts

[11] Patent Number: 6,158,952
[45] Date of Patent: Dec. 12, 2000

[54] ORIENTED SYNTHETIC CRYSTAL ASSEMBLIES

[76] Inventor: Ellis Earl Roberts, P.O. Box 6310, Los Osos, Calif. 93412

[21] Appl. No.: 08/937,062

[22] Filed: Sep. 24, 1997

Related U.S. Application Data

[62] Division of application No. 08/299,240, Aug. 31, 1994.
[51] Int. Cl.[7] .................................................... B65G 57/00
[52] U.S. Cl. .......................... 414/798.2; 198/383; 198/396
[58] Field of Search ................................... 414/757, 781, 414/784, 798.2; 53/525, 543, 523, 113; 198/382, 394, 383, 396, 409

[56] References Cited

U.S. PATENT DOCUMENTS

| 1,654,706 | 1/1928 | Schoen . | |
|---|---|---|---|
| 1,688,406 | 10/1928 | Tiffany . | |
| 3,230,672 | 1/1966 | Anthon | 51/404 |
| 3,881,605 | 5/1975 | Grossman . | |
| 4,811,831 | 3/1989 | Honkomp et al. | 198/394 |
| 4,916,869 | 4/1990 | Oliver | 51/293 |
| 4,925,457 | 5/1990 | Dekok | 51/293 |
| 5,129,874 | 7/1992 | Hayer, III et al. | 414/754 |
| 5,263,567 | 11/1993 | Costa | 198/382 |
| 5,304,223 | 4/1994 | Pieper et al. | 51/293 |

FOREIGN PATENT DOCUMENTS

| 0538798A1 | 4/1993 | European Pat. Off. | H01L 23/373 |
|---|---|---|---|
| WO9201827 | 2/1992 | WIPO | C30B 25/02 |

OTHER PUBLICATIONS

Geis, et al., "Large Area Mosaic Diamond Films Approaching Single Crystal Quality," Applied Physical Letters, vol. 58, No. 22 (Jun. 3, 1991), 2485–2487.

Primary Examiner—Robert P. Olszewski
Assistant Examiner—Steven B. McAllister
Attorney, Agent, or Firm—Leo F. Costello

[57] ABSTRACT

An integrated continuous assembly of synthetic crystals of diamond, or like materials, which exhibits crystallographic characteristics substantially the same as a single crystal so that characteristics of diamond such as abrasive resistance, thermal conductivity, electrical properties and chemical vapor deposition are more fully utilized for various applications. The crystals are of substantially uniform size and of cubic and cubo-octahedral shapes, each having a crystallographic direction of maximum abrasive resistance lying along a diagonal of the crystal. The crystals are assembled with their mating faces in congruent contact with respectively adjacent mating faces of adjacent crystals, and with their exposed face substantially coplanar with the exposed faces of adjacent crystals to form a common surface for the assembly. The diagonals of diagonally related crystals are aligned and the aligned diagonals are parallel to each other so that said common surface has a crystallographic direction of maximum abrasion resistance lying along a diagonal of the common surface. A method and apparatus for forming the article are also provided.

12 Claims, 6 Drawing Sheets

ORIENTED SYNTHETIC CRYSTAL ASSEMBLIES

This application is a division of application Ser. No. 08/299,240, filed Aug. 31, 1994.

BACKGROUND OF THE INVENTION

1. Field of the Invention

This invention relates to oriented synthetic crystal assemblies and more particularly to an assembly of synthetic crystals of diamond, or like materials, positioned together and oriented so as to provide the assembly with enhanced physical properties, and to a method and apparatus for making the assembly.

2. Description of the Related Art

Diamond crystals have numerous physical properties that are well known and which have great utility for industrial purposes but which in the past have not been fully exploited. These properties include abrasion resistance, thermal conductivity, electrical insulation, and receptivity to the deposit of a layer of diamonds by chemical vapor deposition.

More specifically, it has long been known that diamond crystals have a very high degree of abrasion resistance and that this resistance varies with the crystallographic direction of abrasion by a factor of as much as about one hundred times. This most resistant direction is along the diagonal of a cubic face in the plane of the face. (See Denning, R. M. "Directional Grinding Hardness in Diamond," *American Mineralogist*, (1953) 38, 108–117.)

Furthermore, the thermal conductivity of diamond reaches a value of up to five times that of metallic copper. (See Wilks, J. and Wilks, E. *Properties and Applications of Diamond*, Butterworth-Heinmann Ltd., Oxford (1981), 166 and 512.)

The electrical properties of diamond useful in semiconductor applications have been recognized by Wilks, J. et al., op. cit., p. 63 and others, e.g., the Geis et al. PCT application WO 92/01827 published 6 Feb. 1992, and Geis et al. "Large-Area Mosaic Films Approaching Single-Crystal Quality," *Applied Physical Letters*, Vol. 58, No. 22 (3 Jun. 1991), 2485–2487.

Still further, it is known that diamond can be deposited as a layer by chemical vapor deposition onto a crystal of diamond and retain the crystallographic orientation of the diamond substrate with an epitaxial relationship. (See Wilks, J. et al., op. cit., p. 20 et seq.)

Notwithstanding the knowledge of these properties over many years, the prior art has failed to recognize how to take full advantage of them. Wilks, J. et al., op. cit., pp.17–20, records that large blocks of polycrystalline diamonds, known as PCD, have been produced by sintering together a mass of fine diamond crystallites in randomly oriented manner to minimize cleavage and thus improve strength and hardness, but such random orientation of the crystallographic directions of the crystals does not optimize the property of abrasion resistance in the block as a whole that is inherent in an individual diamond crystal.

Again, the sintering or binding material in a block of PCD occupies a substantial proportion of the volume of the block and is of a much lower thermal conductivity than diamond. As a result, the thermal conductivity of the block is much lower than could be achieved with a pure or more nearly pure block of diamond. Also, the sintering material is typically metallic and is a good electrical conductor, whereas diamond is known for its electrical insulating properties. Thus, blocks of PCD do not take advantage of the electrically insulating properties of diamond.

Still further, the random orientation of such sintered fragments or crystals in PCD does not permit chemical vapor deposition of a layer of a single crystal of diamond on a surface of a block of PCD.

More recently, the cited Geis et al. references recognize that diamond's excellent electrical properties have not been fully utilized in semiconductor devices. These references teach the placing of synthetic diamond seed crystals of 0.10 mm diameter or less in spaced complementary pits or grooves, and subsequently growing a film about the seeds by chemical vapor deposition. Geis et al. intentionally separate the seed crystals to enable the CVD crystal growth to envelope the seeds. Thus, although Geis et al. state that such placement orients the crystallographic directions, their method creates spaces or gaps between adjacent seed crystals. Thus, they state that at the point where adjacent crystals merge, there is the possibility that crystal defects may occur. Moreover, Geis et al. is concerned with electrical applications and thus does not teach how to produce a bearing surface having a crystallographic direction of maximum abrasive resistance.

In understanding the problems with the prior art and the solutions realized by the present invention, it is important to recognize that diamond crystals have long been synthesized in several shapes. Diamond crystals in shapes ranging from cubic to cubo-octahedral to octahedron shapes have thus been synthesized for many years and are commercially available. By regulating the temperature, pressure, and chemical environment of synthesis, it is possible to synthesize cubic or predominantly cubic diamond crystals. (See Litv, Y. A. and Butuzov, V. P. "Growth of Synthetic Diamond Crystals," *Soviet Physics-Duklody* Vol. 13, No. 8 (February 1969), 746, 747 or Wilks, J. et al., op. cit., p. 127.) Also, it is noted that such crystals in sizes approximating 1 mm have been commercially available for many years (Wilks, J. et al., op. cit., p. 14).

SUMMARY OF THE INVENTION

The present invention solves the described prior art problems by assembling synthetic diamond crystals of predominantly cubic shapes with their side faces in congruent contact to form a mosaic assembly and with their exposed faces in coplanar relation to form a common surface for the assembly. The crystals are oriented in the assembly so that the crystallographic directions of the individual crystals, along the diagonals of the crystals, are aligned, whereby the common surface exhibits a maximum crystallographic direction of hardness in the plane of the common surface and along the aligned diagonals.

It is an object of this invention to take greater advantage of certain physical properties of diamonds and like materials, including abrasion resistance, thermal conductivity, electrical properties, and the ability to receive diamond deposits by chemical vapor deposition.

It is an object of this invention to provide an article of manufacture composed of synthetic crystals of diamond, or like materials, of substantially uniform size, and of cubic or nearly cubic shapes, integrated in a continuous assembly wherein the crystals are in side-by-side contact and have their crystallographic directions aligned.

It is another object of this invention to assemble cubic or nearly cubic crystals of diamond, or like materials, in a continuous assembly of such crystals with the crystallographic directions of the crystals aligned so as to provide the assembly with a direction of maximum abrasion resistance.

It is an object of this invention to place crystals of substantially uniform shapes and having common crystallographic structures in a layer or sheet with the crystals in side-by-side contact to provide a smooth continuous surface which has a gradient of directional hardness in the plane of the surface varying from a maximum along a first line to a minimum along a second line at an angle to the first line.

It is a further object of this invention to provide an integrated assembly of synthetic crystals of diamond, or like material, and of substantially the same size and of cubic or cubo-octahedral shapes with the individual crystals similarly oriented in side-by-side contact so that the assembly has a common surface with a cubic pattern and composed of the coplanar faces of individual crystals and so that said common surface has a direction of maximum abrasion resistance along a diagonal of the cubic pattern and in a plane of the surface.

Still another object of this invention is to provide an integrated assembly of synthetic crystals of diamond, or like material, and of substantially the same size and of cubic or cubo-octahedral shapes with the individual crystals similarly oriented and tightly packed in side-by-side contact without binding or foreign material between the contacting faces so that the thermal conductivity and electrical insulating properties of the assembly are substantially the same as the thermal conductivity and electrical insulating properties of the individual crystals.

It is an object of this invention to provide an integrated assembly of synthetic crystals of diamond, or like material, and of substantially the same size and of cubic or cubo-octahedral shapes with the individual crystals similarly oriented in side-by-side contact with their crystallographic directions aligned and so that the assembly has a common surface on which a coating of diamonds is deposited by chemical vapor deposition whereby the crystallographic direction of the diamond in the coating has the same alignment as the crystals in the assembly, whereby the deposited coating is doped with electrical impurities for semiconducting purposes, and whereby the assembled crystals serve as an electrically non-conducting substrate.

It is a further object of this invention to provide a method of producing an integrated assembly of synthetic crystals of diamond, or like materials, of cubic or cubo-octahedral shapes so their directions of crystallographic hardness are aligned so that the assembly can be used as a bearing, a heat sink, or as a semiconductor.

Yet another object of this invention is to provide a method of producing an integrated assembly of synthetic crystals of diamond, or like materials, of cubic or cubo-octahedral shapes so that their directions of crystallographic hardness are aligned and so that the cubic faces form a smooth surface which can be flat or curved and which has a direction of maximum abrasion resistance along a diagonal of the assembled cubes in the plane of the surface.

It is a further object of this invention to provide a method of providing an article useful as a bearing, heat sink, or a semiconductor device including the steps of integrating a substrate of synthetic crystals of diamond, or like materials, of cubic or cubo-octahedral shapes with their individual cubic faces forming a larger smooth common cubic surface which can serve as a bearing surface or as a bed for the chemical vapor deposition of a layer of the same material as in the substrate and which can be doped with impurities for semiconducting purposes.

It is another object of this invention to provide an apparatus for producing an integrated assembly of synthetic crystals of diamond, or like materials, of cubic or cubo-octahedral shapes so their directions of crystallographic hardness are all aligned.

BRIEF DESCRIPTION OF THE DRAWINGS

FIGS. 9a–9d, 10a–10b, 11a–11d, and 12a–12f are schematic views which illustrate steps of several embodiments of the method of this invention to produce the oriented crystal assemblies for various applications, the Figs. being enlarged from actual size.

DESCRIPTION OF THE PREFERRED EMBODIMENT

Article of Manufacture

Figure 1:
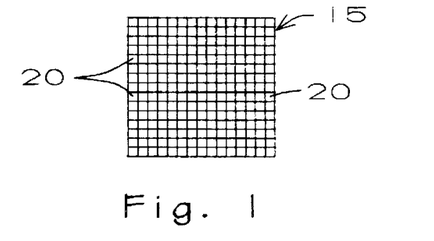
FIG. 1 is a plan view, enlarged approximately two times actual size, of an assembly of synthetic cubic crystals of diamond, or like material, made in accordance with the present invention.

The present invention provides an assembly 15 (FIGS. 1 and 2) of synthetic crystals 20 of diamond, or like materials, which are positioned and oriented in a mosaic pattern and, in the embodiment of FIG. 1, are bound in such assembly by a binder coating 18. The crystals are oriented so as to provide the assembly with enhanced physical properties which, although heretofore known for single crystals, have not previously been fully exploited. Full advantage of these properties cannot be realized with an individual crystal because of its minute size. Moreover, until the present invention, the crystals have not been collectively utilized in the most optimum manner to fully exploit these properties.

Figure 3:
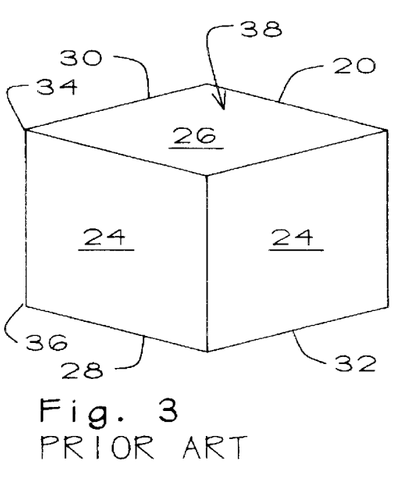
FIG. 3 is an isometric view of one of the synthetic cubic diamond crystals which in and of itself is known in the prior art. The crystal is illustrated in greatly enlarged size from the sizes, e.g., 0.75 mm to 1.00 mm, which are currently available and which are employed in the embodiments of the invention described herein.
Figure 4:
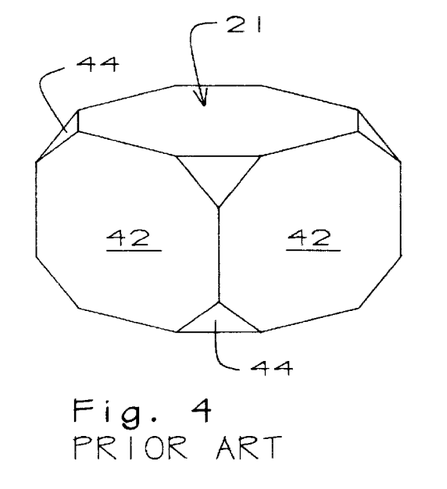
FIG. 4 is an isometric view of a synthetic cubo-octahedral diamond crystal which is also known in the prior art and is enlarged similarly to FIG. 3.

To understand the principles of the present invention, it is useful to refer initially to a single synthetic diamond crystal, as 20 and 21 in FIGS. 3 and 4. These crystals are produced in various shapes, namely, from perfect cubes (such as illustrated in FIG. 3); to a range of cubo-octahedrons where the crystal faces vary from predominantly cubic and minimally octahedron (such as illustrated in FIG. 4); to predominantly octahedron and minimally cubic (not shown); to perfect octahedrons (not shown). The present invention is based upon the use of predominantly cubic crystals, that is perfect cubes, as shown in FIG. 3, or nearly cubic, that is cubo-octahedral, crystals where the cubic faces predominate and the octahedral facets are minimal in size, as shown in FIG. 4.

By regulating the temperature, pressure, and chemical environment of synthesis, it is possible to synthesize cubic or predominantly cubic diamond crystals, such as 20, 21, respectively, in FIGS. 3 and 4, and such crystals are commercially available up to about one millimeter in size.

The cubic crystal 20 in FIG. 3 represents the described commercially available synthetic diamond crystals and, for purposes of subsequent reference, is identified as having four side faces 24, a top face 26, a bottom face 28, top edges 30, bottom edges 32, top corners 34, and bottom corners 36. These faces are of course square and are referred to in the art and herein as cubic faces or as being in cubic planes. The reference to sides, tops and bottoms does not imply any particular orientation of a crystal but facilitates explanation of the relationship of adjacent crystals in the subsequent description.

The cubo-octahedral crystal 21 (FIG. 4) has six faces 42, which are commonly referred to as cubic faces since that is their predominant shape, and eight smaller octahedral facets 44 at the corners. Crystal 21 is thus referred to as a predominantly cubic crystal since the octahedral facets are relatively small as compared to the cubic faces.

Figure 5:
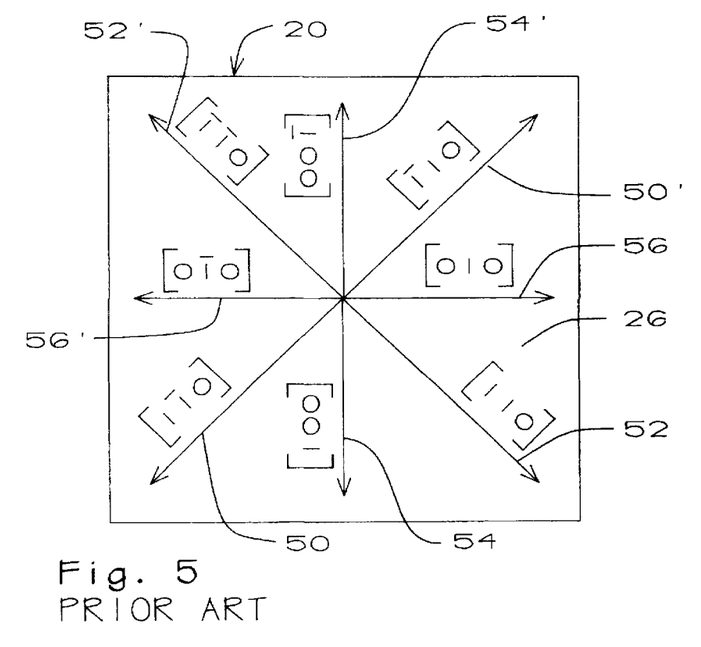
FIG. 5 is a still further enlarged view of one of the cubic faces of the crystal of FIG. 3 showing the Miller directional indices of hardness (bracketed numbers) in the plane of the cube face.

With reference to FIG. 5., a brief description is set forth of certain known crystallographic characteristics of a synthetic diamond crystal, as 20 or 21, which are fully exploited in the present invention. FIG. 5 shows one of the faces, for example the top face 26, of the crystal 20, which face of course is a planar face. The diamond crystal is known to have crystallographic directions of maximum abrasive resistance or hardness in the plane of the cube face along the diagonal lines 50, 50' and 52, 52' of the face and crystallographic directions of minimum abrasive resistance or hardness along lines 54, 54' and 56, 56' which are forty-five degrees from the diagonals or directions of maximum resistance. The appropriate Miller directional indices for these lines are denoted in FIG. 5.

Figure 2:
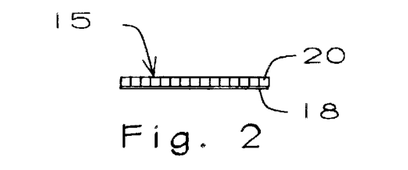
FIG. 2 is an elevation or edge view of the assembly of FIG. 1.
Figure 6:
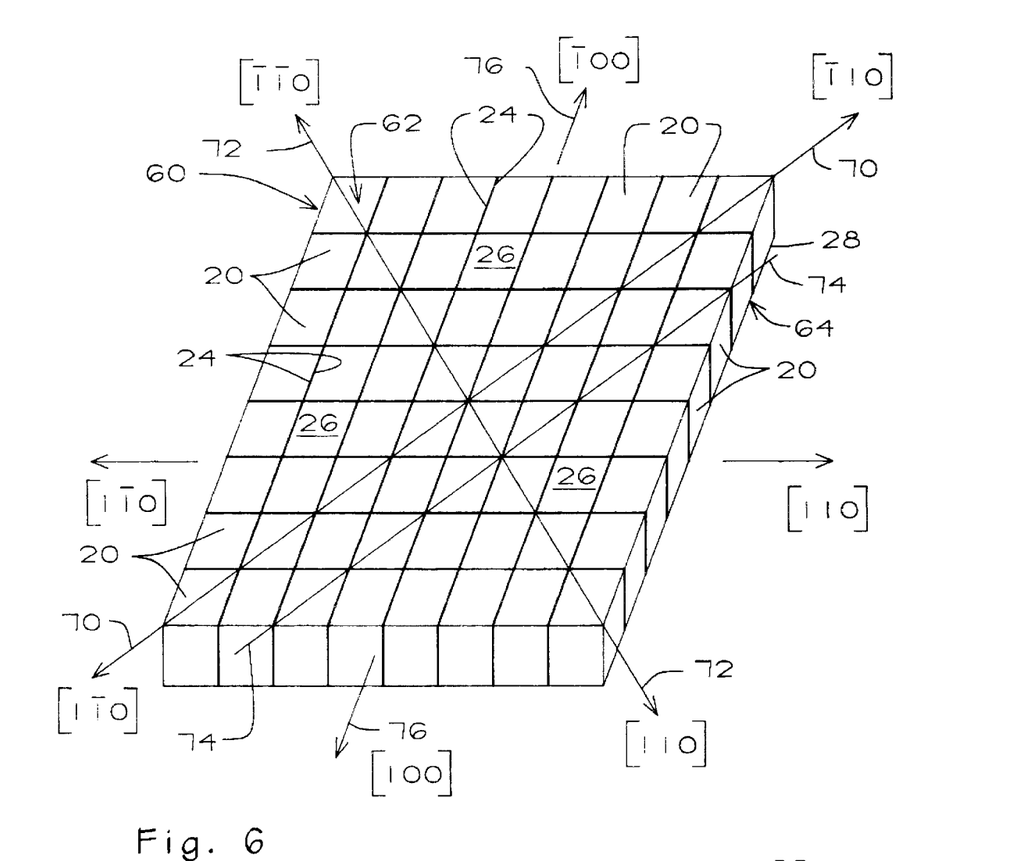
FIG. 6 is an isometric view of an integrated assembly, mosaic or sheet of synthetic cubic diamond crystals, as provided by the present invention, and illustrating the aligned crystallographic directions of hardness by directional arrows and Miller indices. Again, the crystals and thus the assembly are enlarged from the actual sizes, although reduced in size from FIG. 3. It is also noted that the crystals shown in FIG. 6 as well as other isometric views herein are in fact cubic, although they may not appear so because of the rules of isometeric projection.

The present invention is primarily concerned with an assembly, array, sheet or mosaic 15 of the synthetic cubic diamond crystals 20, which assembly is shown in FIGS. 1 and 2 as approximately twice actual size. In order to explain the principles of this invention, however, it is necessary to use illustrations considerably more enlarged from actual size than even FIGS. 1 and 2. Such an enlarged assembly is shown in FIG. 6 and is indicated by reference numeral 60. It is understood that the assembly 60 may be regarded as merely a segment of the assembly of FIG. 1.

The crystals 20 are placed in the assembly 60 in an integrated, tightly packed mosaic pattern. In forming the assembly, the crystals are placed in side-by-side and edge-to-edge relationship with adjacent side faces 24 of adjacent crystals in mating congruent contact so as to eliminate or at least greatly reduce any gaps between the crystals and to restrict intrusion of contamination or foreign material. In the assembly, all the top faces 26 of the crystals are in a common plane which thus creates a top, outwardly directed surface 62 of the assembly, and all of the bottom faces 28 of the crystals are coplanar and define a bottom, outwardly directed surface 64.

Figure 7:
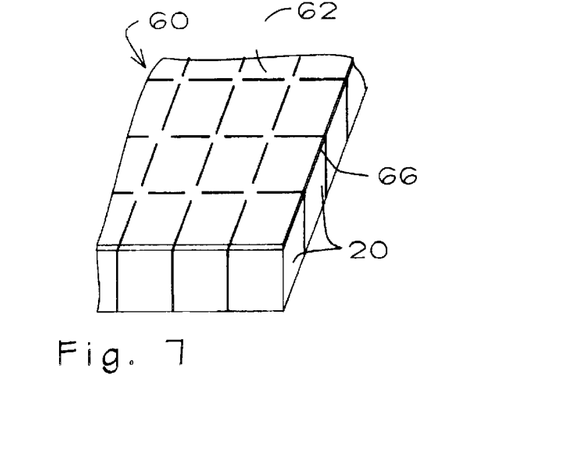
FIG. 7 is an isometric view of a corner of the assembly of FIG. 6 showing a binder applied to the crystals and showing in dashed lines the edges of crystals under the binder.

The crystals 20 are integrated or bonded together in the assembly 60 by one or more of several bonding techniques, as subsequently described in greater detail. One of these bonding techniques is an adhesive coating 66 over either the top surface 62, as shown in FIG. 7, or over the bottom surface, not shown.

Of greatest significance, the crystals 20 (FIG. 6), by virtue of their substantially same size and predominantly cubic shape and by virtue of their described assembly 60, are oriented with their crystallographic directions of maximum abrasive resistance either aligned with, or parallel to, each other. Alignment occurs because the crystallographic directions 50, 50' of each crystal (FIG. 5) are aligned with the corresponding directions 50, 50' of all the other crystals lying in a row along one of the principal diagonals 70 (FIG. 6) of the assembly. Likewise, the crystallographic directions 52, 52' (FIG. 5) of the crystals lying in a row along the other principle diagonal 72 (FIG. 6) of the assembly are aligned. Parallelism occurs because these directions, as 50, 50', are parallel to such directions of the crystals in other shorter, diagonal rows, one of which is indicated by line 74 in FIG. 6.

Furthermore, the directions of minimum abrasive resistance 54, 54' (FIG. 5) are aligned and parallel to each other in a similar manner and as represented by line 76 in FIG. 6, and this line is at forty-five degrees separation from the lines of maximum resistance 70,72.

In its basic form, the assembly 15 (FIG. 1), or 60 (FIG. 6), comprises only one layer of crystals 20 and may be of any practical surface area, that is, any practical number of crystals, limited only by the assembly space and the particular use or application of the assembly. By way of example only, the assembly in FIG. 1 includes two-hundred twenty-five crystals with an actual size of approximately fifteen millimeters by fifteen millimeters square and slightly in excess of one millimeter thick allowing for the thickness of the binder 18. In contrast, the assembly of FIG. 6 includes sixty-four crystals and would measure about 8 by 8 by 1 mm in actual size.

In addition to the term "assembly," the terms "array," "sheet," "mosaic," and "block" are used to describe the article of manufacture provided by the present invention. Other terms could be used without affecting the principles described herein. It is understood that the use of these terms does not imply any particular surface area or size of the assembly 15 (FIG. 1) or 60 (FIG. 6). Also, the perimeter or outside edge of the assembly need not be rectangular and may have other regular or irregular configurations since the principles of the invention still apply along the diagonals of the assembly as governed by the cubic crystal faces 26 (FIG. 6) within the margins of the assembly. Again, reference to top and bottom surfaces 62 and 64 does not imply use of the assembly in any particular orientation but is for convenient description of assembling the crystals 20. If desired for some applications, multiple assemblies, not shown, may be bonded together in edge-to-edge coplanar relation to form a much larger surface area. Also, multiple assemblies may be bonded together in stacked, layered relation, also not shown. In any case, the crystals are assembled so that their crystallographic directions are oriented in the same direction, in accordance with the principles of this invention. Multiple layers also occur upon chemical vapor deposition, as subsequently described.

Method of Making the Article

Figure 8:
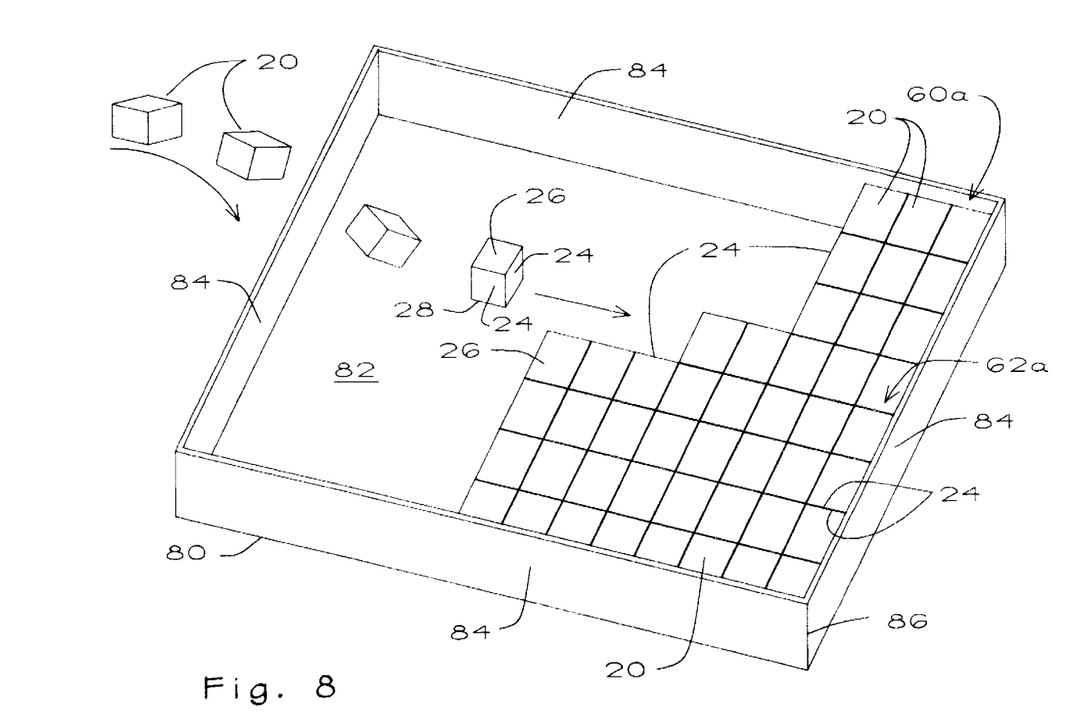
FIG. 8 is also an isometric view of the initial steps of assembling cubic diamond crystals into an integrated mosaic by placing the crystals in side-by-side contact on the bottom flat surface and in the corner of a tray inclined toward the corner. The scale is reduced from FIG. 6 but is still much larger than actual size.

In general, the method of the present invention may be divided into two parts for descriptive purposes, namely, initially assembling the crystals 20, 21 so as to form the assembly 15, and secondly, binding the crystals in the assembly. FIGS. 8 illustrates the steps of assembling the crystals, and FIGS. 9 through 12 illustrate four embodiments of binding the crystals in the assembly.

The initial part of the method, namely, placing the diamond crystals 20, 21, in an assembly 60a is thus described by reference to FIG. 8. One of the first tasks is to select the crystals to be used. Synthetic diamond crystals of substantially cubic shape or of cubo-octahedral shape where the cubic faces predominate are chosen. Also, the crystals used should be of substantially the same size. Currently, crystals are available up to about 1 mm on an edge, but as synthetic growing techniques improve, larger crystal sizes may become available. If not already accomplished, the supply acquired should be sized to insure that the crystals used are of substantially the same size, preferably from 0.75 mm to 1 mm or larger if available. The crystals may be sized by known methods such as by screening or by settling in a fluid in accordance with Stokes Law. As previously noted, only perfectly cubic crystals 20 are shown in FIG. 8, but the method described is equally applicable to the cubo-octahedral crystals 21 with predominantly cubic faces 42.

Single cubic diamond crystals 20 are dropped (FIG. 8) one at a time or in limited numbers into a tray or receptacle 80 having a planar bottom surface 82 and side walls 84 defining a corner 86 of the tray which has the shape of a corner of a cube. The tray is tilted toward the corner and is gently shaken, vibrated or tapped in the plane of the bottom surface. When the crystals land on the bottom surface 82, they attain a stable position on one of their faces, for example the bottom face 28. Stability occurs because of the cubic shape of each crystal; the angle of tilt of the tray; the mass of the crystal; and the material of the tray, more particularly the bottom surface 82. Then, because of the tilt and vibration of the tray, the crystals slide toward the corner. The angle of tilt of the tray and the vibrating action are adjusted to achieve this stabilization and sliding action. In the described embodiments, the tray is preferably made of high density polyethelene, PTFE, graphite, a refractory, or other material which has a coefficient of friction to promote the described stabilty and sliding action of the diamond crystals.

As the crystals 20 slide into the corner 86 of the tray 80 (FIG. 8), they align themselves with the side walls 84 of the tray or with the side faces 24 of crystals that are already in oriented positions in the corner and thereby build up the assembly 60a of crystals in a layer, one crystal thick. Use of needle point tweezers, not shown but commonly available, may be used to reposition any errant crystals. The side faces of adjacent crystals are in congruent contact with each other, and the top faces 26 of all the crystals in the assembly form the common planar surface 62. This results in all the crystals being oriented in the same crystallographic direction, as explained above in describing the assembly 60 in FIG. 6.

After the crystals 20 are positioned in the assembly 60a (FIG. 8), they are bound together in accordance with the second part of the method of this invention, now described with reference to the four embodiments shown in FIGS. 9–12. In describing these embodiments, all of the crystals are shown as cubo-octahedral crystals 21 with predominantly cubic faces 42, but it is understood that in actual use, the crystals may be a mixture of cubic crystals 20 and such cubo-octahedral crystals 21. Only cubo-octahedral crystals are shown in FIGS. 9–12 because of illustrative convenience and because it facilitates description of the binding and grinding steps of the methods.

Figure 9:
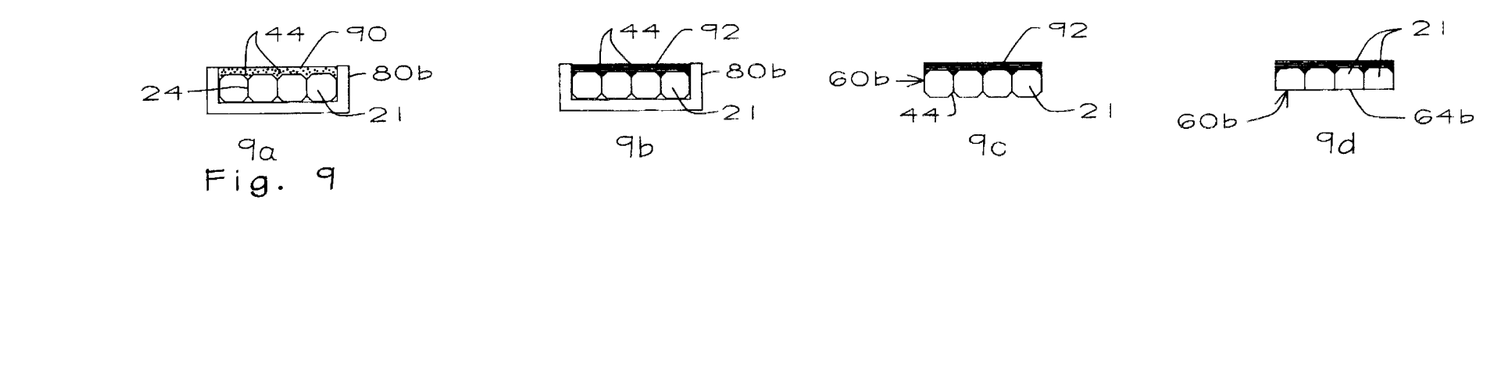
Figure 10:
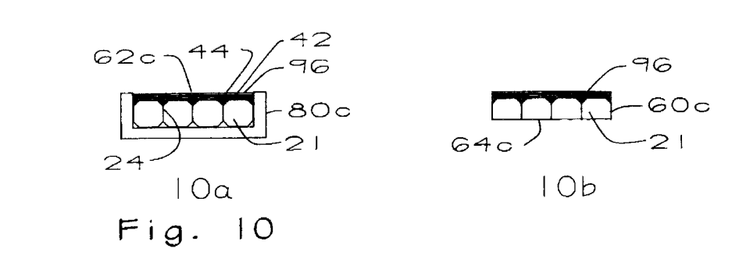
Figure 11:
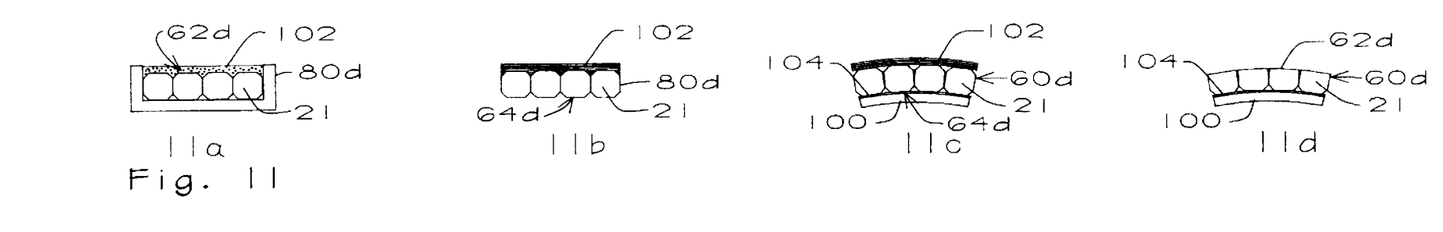
Figure 12:
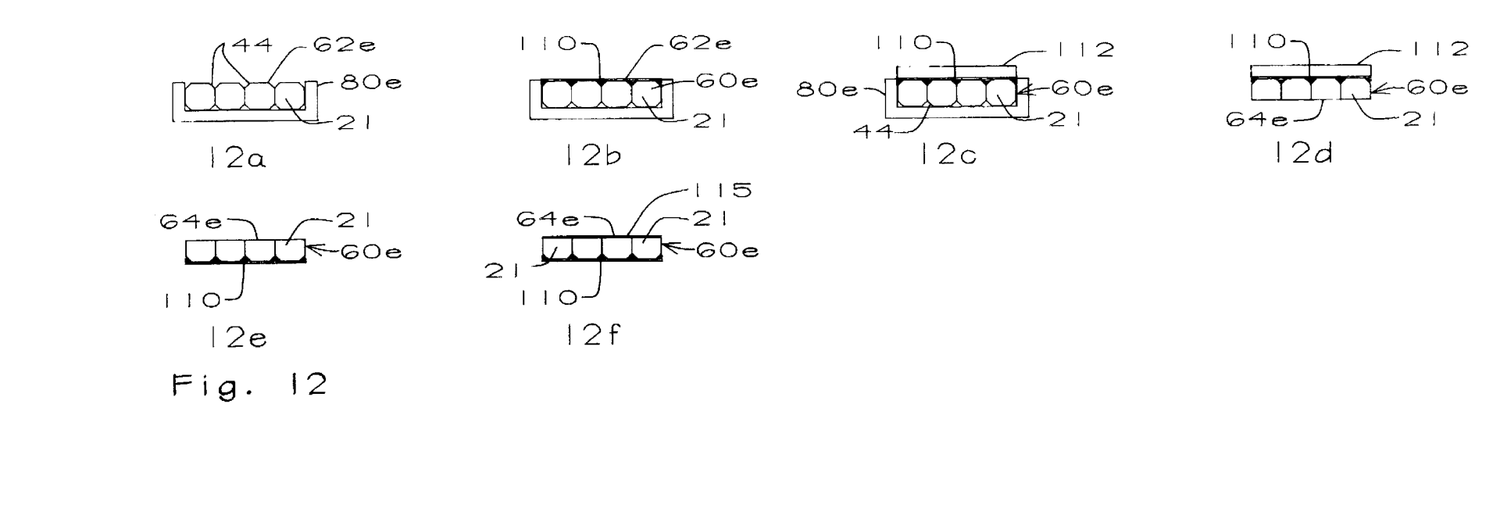

With reference first to FIGS. 9a through 9d, the steps are described for binding crystals 21 in an assembly 60b which has utility for abrasion resistance and heat sink purposes. It is noted that FIGS. 9–12 are schematic views involving only a few crystals and are intended primarily to show the principles of the method. Cubo-octahedral synthetic diamond crystals 21 (FIG. 9a) with large cubic faces 42 and relatively small octahedral facets 44 and approximately one millimeter in size are contained and oriented in a tray 80b, for example in the manner discussed with reference to FIG. 8. The crystals in the tray are then covered with a metal infiltration powder 90, such as Macrofil, a product available from Kennametal Inc. of Latrobe, Pa., that is capable of wetting the crystals upon heating. The powder is then heated to melting temperature to fuse the metal to the surface of the crystals and to draw it by capillary action into interstices between the top corners or octahedral facets 44 of the crystals. It is to be understood that the tray is made of a heat-resistant material, such as graphite, which is not wetted by the metal. The molten metal is then allowed to cool and solidify to form a binder coating 92 (FIG. 9b), whereupon the crystal assembly is removed from the tray (FIG. 9c). Finally, the bottom surface 64b of the assembly is ground to remove the octahedral facets and to produce a smooth coplanar surface.

The embodiment of the method described and illustrated in FIGS. 8 and 9a–9d produces the bearing surface 64b which has a maximum abrasive resistant direction along the aligned diagonals of the crystals 21, as fully described above in discussing FIG. 6. Using the principles of FIGS. 9a–9d, an article, as 15 (FIG. 1), is produced which is useful as a bearing member with an exceptionally high abrasion resistance along the defined direction. It is significant to note, however, that the method also causes, and the article exhibits, a direction of minimum abrasive resistance, and it is along this line that the grinding occurs in achieving the smooth planar surface 64a. Thus, by following the principles of this invention both maximum and minimum abrasive directions are fully achieved and exploited. In addition, the article is useful as a heat sink since the cubic faces 24 of the crystals are in intimate contact and allow maximum heat conductivity across the interfaces of the crystals. The metal binder 92 enters essentially only the interstices between the octahedral facets 44 of the crystals and thus does not contaminate the main body of the assembly and interfere with the excellent thermal conductivity of diamond. The bearing surface or heat sink can be enlarged by including more crystals in the assembly 15 or by duplicating the assembly and mounting the assemblies so provided in contiguous edge-to-edge generally coplanar relationship to form a larger assembly of crystals, as will be understood although not shown.

FIGS. 10a and 10b illustrate another embodiment of the method for binding synthetic diamond crystals, as 20, 21, in an assembly or layer 60c for abrasion-resistant or heat sink uses. Following the assembly steps described above with reference to FIG. 8, the diamond crystals are assembled in a tray, box, or other suitable receptacle 80c (FIG. 10a). The tray is of a material, such as high density polyethylene, that does not adhere to the binding cement, such as an epoxy resin, to be used. A coating 96 of this cement of about 4 mm thick is applied to the upper surface 62c of the layer of crystals and subsequently cured. The cement coats the octahedral facets 44 of the crystals as well as their top faces 42. Penetration of the cement into the upper interstices between the octahedral facets may be enhanced by vacuum impregnation without affecting the intimate face-to-face contact throughout substantially all of the area of each side face of adjacent crystals in the assembly. Following curing of the cement, the assembly is removed from the tray (FIG. 10b), and the lower surface 64c is ground to a smooth planar bearing surface, in the manner discussed with regard to FIG. 9d.

FIGS. 11a through 11d show still another embodiment of the method steps for binding an assembly 60d of the crystals 21 for the various uses the present invention discloses but on curved surfaces, such as substrate 100. The crystals are assembled and oriented in a tray 80d (FIG. 11a), in the manner previously discussed, and then the upper surface 62d is coated with a dissolvable flexible cement 102 that binds the crystals in the assembly but does not adhere to the tray. The cement selected may be a rubber cement, such as Sanford's rubber cement No. 00494 available from the Sanford Corporation of Bellwood, Ill., and the tray may be made of high density polyethelene or PTFE. A permanent cement 104, such as an epoxy cement, is then applied to the substrate (FIG. 11c). The integrated assembly is removed from the tray (FIG. 11b), and the lower surface 64d is pressed against the uncured cement on the curved substrate. The assembly and its binding cement flex to conform to the curvature of the substrate (FIG. 11c). The flexible cement 102 is then dissolved and removed by a solvent, such as heptane (FIG. 11d). The exposed surface 62d may be ground smooth or allowed to remain in unfinished condition, depending on the desired application. For example, an unfinished rougher surface would be useful where the assembly is used as a grinding mill liner, whereas the smooth finished surface is useful where the surface 62d is be used as a bearing surface. In this regard, it is to be understood that the flexible assembly may be applied to a convex curved surface, shown in FIGS. 11c and 11d, or to a concave curved surface, not shown. Although either curvature finds various applications, the concave surface application is an example of a grinding mill use. Again, the area or size of the bearing surface can be enlarged as described in referring to FIGS. 9a–9d.

FIGS. 12a through 12f are referred to in describing another embodiment of the binding part of the method of the present invention so as to provide an article of manufacture suitable for electronic, heat sink, or abrasion-resistant uses. In FIG. 12a, the crystals 21 are assembled as previously described in a tray or box 80e which is resistant to about 1000° C. and chemically resistant to chemical vapor deposition (CVD) of diamond. For this purpose a suitable tray material is refractory cement. A first coat 110 (FIG. 12b) of diamond is deposited by CVD on the upper surface 62d which binds the crystals 21 together in assembly 60e While the assembly is still in the tray (FIG. 12c), a rigid backing 112, which may be made of plate glass or aluminum, is temporarily cemented, for example by lapidarist's cement such as stick shellac, to the first coat 110 of diamond to hold the assembly 60e rigidly together to allow grinding. Next, the assembly of diamond crystals as held together by the rigid backing is removed from the tray (FIG. 12d), and the lower surface 64e is finished by a grinding tool, by chemical milling, or by laser machining to provide a smooth coplanar surface 64e with any octahedral facets 44 destroyed.

In the next step (FIG. 12e), the backing 112 and the cement used to attach it are removed by dissolution with a solvent, such as alcohol, or by heating to a temperature of approximately 200° C. Many other temporary cements could also be used and dissolved. A second coat 115 (FIG. 12f) of diamond is then deposited by CVD over the planar surface 64e. It is to be understood that the diamond in both the first and second coats 110 and 115 inherits the orientation of the atomic arrangement of the oriented diamond crystals in the assembly 60e so that the final article is an assembly of pure, single crystal diamond, with all of the crystallographic directions oriented in the same direction. The article 60e is thus ideally suited for the semiconductor, heat sink and bearing purposes discussed herein.

Apparatus

Figure 13:
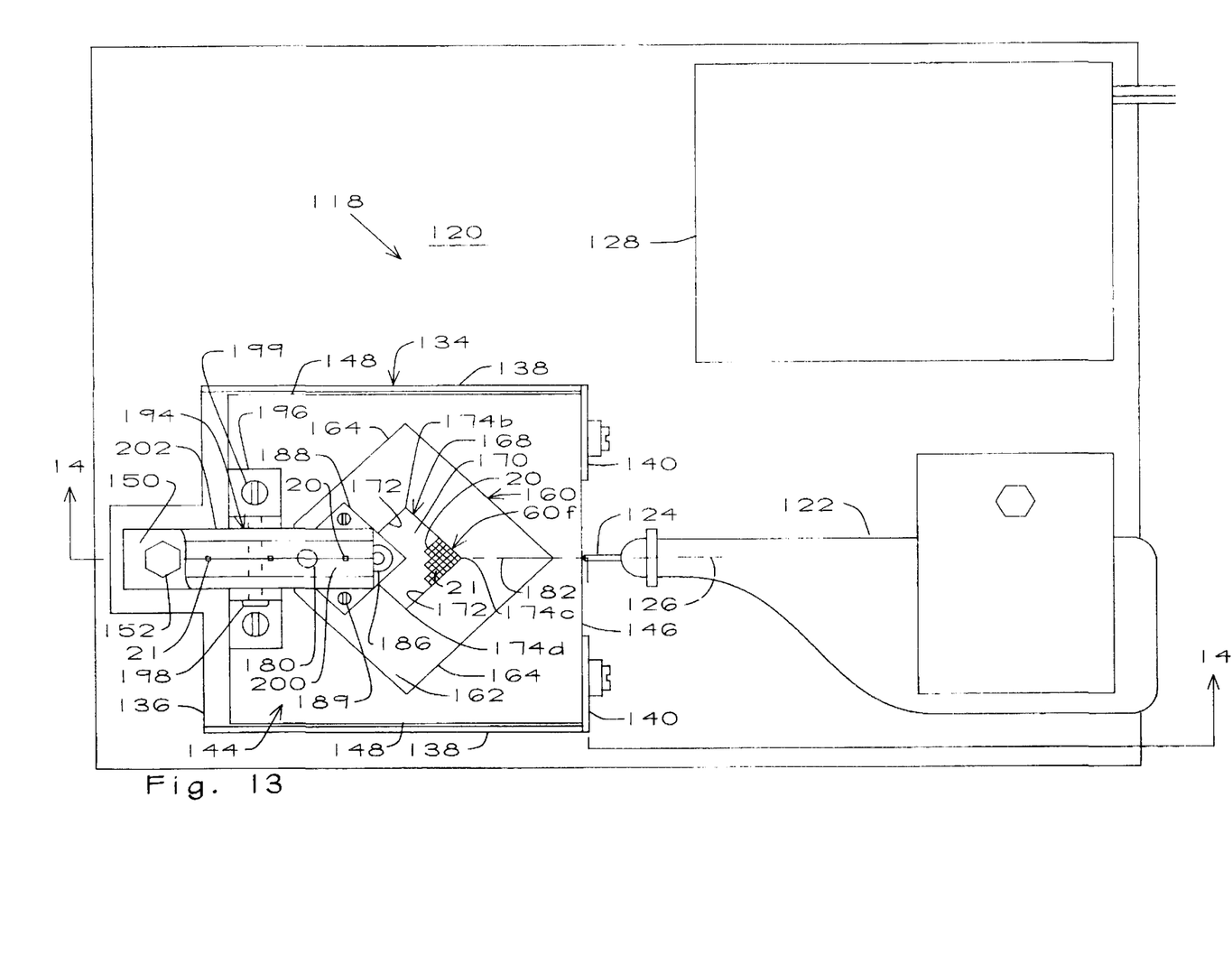
FIG. 13 is a full-scale plan view of an apparatus for placing individual crystals of substantially the same shape and small size into an integrated assembly of crystals in side-by-side contact in accordance with the present invention.
Figure 14:
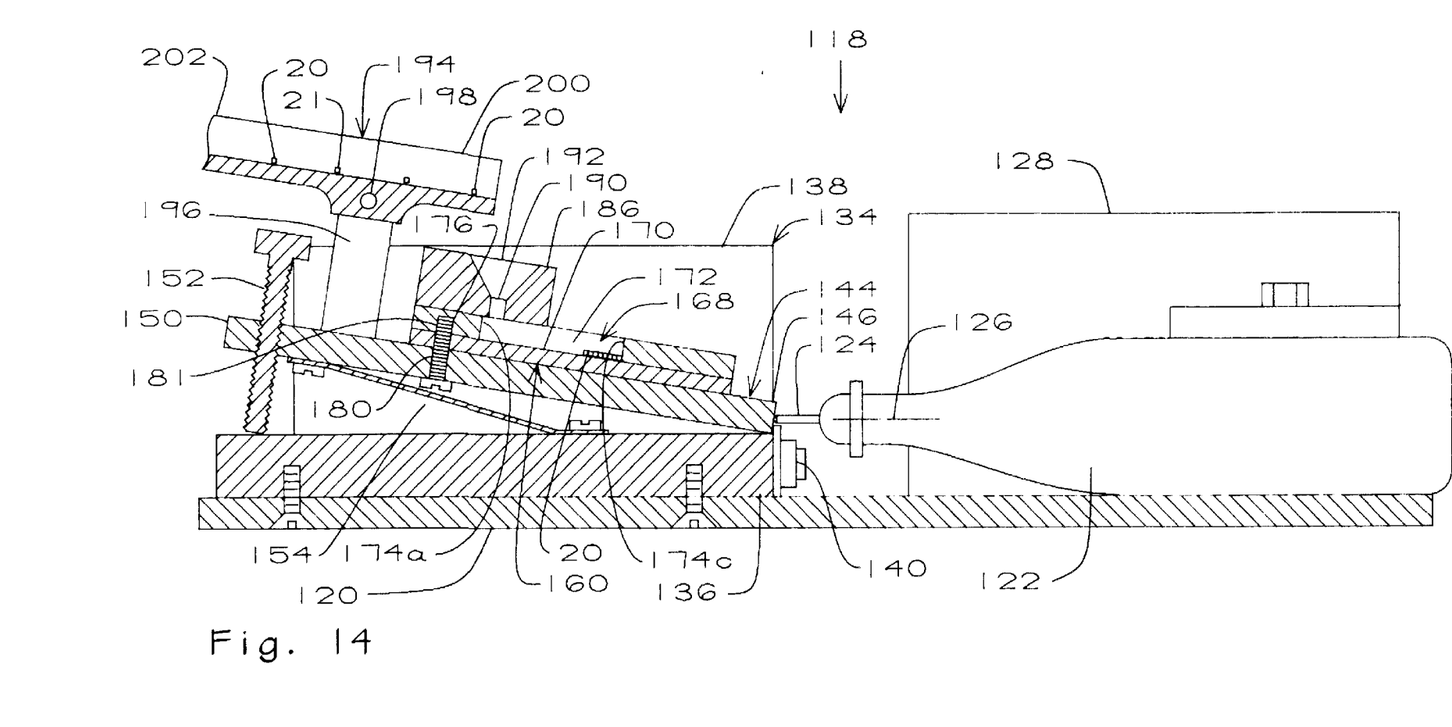
FIG. 14 is a vertical longitudinal section taken along line 14-14 of FIG. 13.

The present invention also provides an assembling apparatus 118 for placing the crystals 20, 21 in the assembly 15, and an embodiment of this apparatus is illustrated in FIGS. 13 and 14. In contrast to FIGS. 1–12 described up to this point, FIGS. 13 and 14 are full scale drawings of the apparatus. Although the actual dimensions of the apparatus are not limiting to the invention, FIGS. 13 and 14 do show a preferred embodiment of an apparatus for handling the very small crystal sizes.

The apparatus 118 (FIGS. 13 and 14) includes a table 120 on which is mounted an electric vibrator 122 having a vibrating anvil 124 which reciprocates on a horizontal vibrating axis 126 when energized by an electric vibrator controller 128. A U-shaped guide channel 134 is also mounted on the table 120 forward of the vibrator 122 and has a horizontal base plate 136, vertical guide walls 138, and rear vertical stop flanges 140. The guide walls project upwardly in spaced parallel relationship from opposite edges of the base plate, and the stop flanges project upwardly in spaced relationship to each other from the rear edge of the base plate.

A rectangular mounting platform 144 (FIGS. 13 and 14) is movably supported in an inclined position on the base plate 136 and between the guide walls 138. Thus, the platform has a lower rear edge 146, side edges 148 (FIG. 13), and an upper projection 150. The lower rear edge slidably rests on the base plate against the stop flanges 140 and the anvil 124, and the side edges 148 are adjacent to and slidable against the guide walls. A mounting screw 152 is threaded through the upper projection and has a lower end resting on the base plate near the forward edge of the latter. The mounting screw thus supports the platform in its inclined position and adjusts the angle of incline.

A tension spring 154 (FIG. 13) has a lower end bolted to the base plate 136 and an upper end bolted to the platform 144 adjacent to the mounting screw 152. The spring is biased to pull the platform downwardly to cause its lower edge 146 to bear against the stop flanges 140 and the anvil 124 and to cause the lower end of the mounting screw to bear against the base plate. The platform is thus maintained in its inclined position but has the freedom to slide or move back and forth and up and down a limited amount between the guide walls 138.

A crystal holding tray, box or receptacle 160 (FIGS. 13 and 14) is provided and is preferably made of one of the materials mentioned earlier herein in describing the tray 80

(FIG. 8) for the method steps. The tray has an outer generally square frame 162 with four side edges 164 and a shallow inner square recess or depression 168 concentric with the frame. The recess is defined by a planar bottom surface 170 and four side edges 172 perpendicular to the bottom surface and meeting in four corners 174a,b,c, and d of the s recess. Each corner thus has the shape of the corner of a cube. The side edges 172 of the recess are parallel with their respectively adjacent side edges 164 of the frame.

The tray 160 (FIG. 14) is positioned flat against the platform 144 and thus is also inclined at the same angle as the platform. The tray is adjustably and removably attached to the platform by a clamping pivot pin 176 which is threaded in and projects upwardly through the platform and into a hole 181 in the underside of the tray. The hole 181 is in the upper corner of the frame 162 adjacent to the upper corner 174a of the recess 168 and has an axis which is in the same plane as but perpendicular to a diagonal line 182 (FIG. 13) passing through the corners 174a and 174c. The pin 176 is thus also in the same plane as and perpendicular to the diagonal line 182. The crystal holding tray 160 (FIGS. 13 and 14) is thus tilted so that the lower corner 174c of the recess is lower than the upper corner 174a. By loosening and then tightening the pin 176, the tray can be pivotally adjusted about the axis of the pin, so that the lower corner 174c can be placed at the lowest point or nadir of the arc defined by the lower corner as the tray pivots about the axis of the pin 176. In this manner the azimuth of the tray is adjustable so as to obtain the optimum position of the lower corner 174c of the recess 168. This is the position illustrated in FIGS. 13 and 14.

A funnel 186 (FIGS. 13 and 14) is optionally mounted on the crystal holding tray 160. The funnel has a body 188 removably attached to the frame 162 by bolts 189 so that a cylindrical spout 190 therein is directed downwardly over the upper corner 174a of the recess 168 with the outlet of the spout immediately above the recess. The funnel also has a frusto-conical mouth 192 diverging upwardly from the spout.

A trough 194 (FIGS. 13 and 14) is mounted in inclined position by brackets 196 attached to the trough by a clamping pivot pin 198 and to the platform 144 by bolts 199 just forward of the tray 160. The trough has a lower end 200 over the mouth 192 of the funnel 186 and an upper end 202. Adjustment of the clamping pin 198 allows the trough to be pivoted so as to enable adjustment of the incline angle of the trough.

In operation of the crystal assembling apparatus 116 (FIGS. 13 and 14), the vibrator 122 is activated at a frequency of about sixty cycles to cause the anvil 124 to gently vibrate the platform 144 and thus the tray 160 in the plane of the bottom surface 170 and generally along the diagonal 182 of the recess 168. A supply of cubic or nearly cubic diamond crystals 20, 21 is used and selected in the same manner as described above with regard to FIG. 8. These crystals are fed in spaced relation to the upper end 202 of the trough 194 on which they migrate down and fall from the trough into the funnel 186. The angle of the trough is adjusted to about ten degrees from horizontal as shown in FIG. 14 to allow the crystals to fall into the funnel at a relatively slow rate, about one at a time. The funnel directs the crystals onto the bottom surface 170 of the tray 160 where they first stabilize with their bottom faces, as 28, lying flat against the bottom surface 170.

Once on the bottom surface 170 (FIG. 13), the crystals 20, 21 slide down the bottom surface toward the lower corner 174c. The angle of the platform 144 and thus the tray is adjusted to an angle of about ten degrees from horizontal as shown to achieve such stability and slideability. Furthermore, adjustment of both the incline and azimuth of the tray together with the action of the vibrator 122, as well as the other factors described above for the method, causes the crystals to slide down the bottom surface toward the lower corner 174c. The crystals first arriving slide into the corner with their side faces, as 24, flush against the side edges 172 of the recess. Subsequently arriving crystals slide against the earlier positioned crystals with their side faces in congruent contact. Crystals continue to be fed to the trough 194 and into the tray 160 until an assembly 60f comprising a two dimensional array of crystals of desired area is achieved. It may be necessary to provide a certain amount of manual assistance using needle-point tweezers, not shown, to insure the described positioning of all of the crystals.

Following one of the embodiments of the method described above with reference to FIGS. 9–12, the assembly 60f of crystals 20, 21 is bound together and removed from the tray 160. For this purpose, the tray may be removed from the platform 144 by backing out the pin 176, and the funnel 186 may be removed from the tray, so that the tray and its assembled crystals are more easily accessible for the binding steps and other processing as previously described.

As an alternative to using the apparatus 118, the assembly 15 may be made with an essentially manual method, and an example of a manually constructed assembly is now described with reference to FIGS. 8. Before any crystals 20 are placed in the tray 80, its bottom surface 82 is coated with a pressure sensitive adhesive, not shown. Using needle-point tweezers, not shown, approximately two hundred synthetic cubic diamond crystals 20 of about one millimeter in size are directly placed one-by-one on the bottom surface, starting in the corner 86 and working outwardly in a mosaic pattern until a full assembly of two hundred crystals is completed. The pressure sensitive adhesive holds each crystal in the correct position in which it is placed as subsequent crystals are added. The assembly of two hundred crystals is then coated with an epoxy cement and cured, and the assembly is removed from the tray. Although this procedure involves a certain degree of manual dexterity, it has the advantage of being able to sort the crystals very precisely, that is to exclude crystals with protruding defects or major dimensional flaws. With an eight percent maximum size variation between crystals, there is about one percent voids between crystals in the assembly, and the angle variation between crystals therein is about five degrees. Although the two hundred crystal assembly is not shown, it would be identical to that shown in FIG. 1 except for the number of crystals and the resultant size.

In summary of the advantages of the present invention, the alignment of the hardest-to-abrade direction, that is the cube face diagonal, of diamond crystals gives superior wear surface, as compared to bonded aggregations of randomly oriented diamond crystals, because of the presentation of the one hundred percent hardest directions and the absence of a softer bonding agent. This is an advantage in sliding-surface bearings or thrust bearings especially in applications with abrasive contamination between the wear surfaces. The reduction in wear lengthens the time between bearing replacement or adjustment, retains the dimensional tolerances between bearing surfaces for longer periods, and retains the smoothness of bearing surfaces for longer periods of service. Friction values of the hardest-to-abrade diamond directions on each other are lower than friction values for random diamond directions. The result is less heat generation, lower power consumption, and less stress on the bearing parts.

The high heat conductivity of diamond makes a superior heat sink to conduct heat away from the heat source. The subject invention produces an extended assembly 15 with almost one hundred percent diamond content, and thus a continuous homogeneous content of diamonds without the diluting effect of binders used in binding diamond crystals.

The present invention also includes a method of producing an extended, voidless assembly 15 of diamond crystals with identical crystallographic directions. Chemical vapor deposition on the assembly of this invention results in a thin layer of diamond with one crystallographic direction because of the epitaxial relationship between the chemically-vapor deposited layer and the substrate of oriented diamond crystals. It is important to regognize that the assembly has one crystallographic direction yielding single crystal quality because the contacting adjacent crystals avoids spaces between the crystals which would otherwise produce defects at the growth boundaries.

The subject invention thus makes possible improved exploitation of diamond's semiconductor properties. Chemically-vapor deposited single-crystal assemblies, as 60e, can be made insulating in character by using pure diamond or can be doped with impurities to yield P or N carriers to make diodes, transistors, radiation detectors, or photo conductor devices. The diamond substrate forms an integral heat sink to allow increased electric current capacity to the devices, and diamond's high temperature and chemical immunity permit devices to function in hostile environments.

In attrition grinding of hard materials to reduce particles to smaller sizes, the wear of machine surfaces by the abrasive action of the particles is costly because the parts wear rapidly and must be replaced, and the parts that wear produce particles that contaminate the product being ground. By applying to the wear surfaces, assemblies or layers 15 of aligned diamond crystals that present the hard-to-abrade directions of the crystals to the abrading directions of the particles being ground, machine wear can be drastically reduced thus saving the cost of new wear surfaces and the cost of replacing them. The great reduction of impurities from wear surfaces is often of critical importance in quality control, and the minuscule contamination by diamond wear surfaces is of a highly inert nature.

The present invention takes advantage of the inherent properties of diamonds and particularly synthetic diamond crystals in the manner described, but it is to be understood that the principles of this invention are equally applicable to other materials that have similar or equivalent crystalline properties.

Furthermore, although preferred embodiments have been shown and described, various modifications and substitutions may be made thereto without departing from the spirit and scope of the invention. Accordingly, it is to understood that the present invention has been described by way of illustration and not limitation.

What is claimed is:

1. An apparatus for making an integrated, tightly packed assembly of oriented synthetic crystals of diamond of predominantly cubic shape and of substantially the same size, comprising:

a cube holder having a bottom surface and sides forming an assembly corner having the shape of a corner of a cube, means mounting the cube holder at a selected angle of tilt so that the bottom surface slopes downwardly toward the assembly corner, means for feeding the crystals onto the bottom surface so that each crystal lands in stable position on the bottom surface with one of its faces lying flat against the bottom surface, and means for vibrating the cube holder so that at said selected angle of tilt, crystals lying on said bottom surface slide along a path of travel into the assembly corner and assemble in side-by-side contact with each other to form a mosaic of crystals whose crystallographic directions are aligned and where the mosaic of crystals has a common surface with a common crystallographic direction.

2. The apparatus of claim 1, wherein the mounting and feeding means cooperate to cause the crystals to slide on the bottom surface lengthwise of a predetermined path toward the assembly corner, and wherein means are provided for adjusting the position of the corner transversely of said path so as to cause said crystals to move toward the assembly corner.

3. The apparatus of claim 1,
   wherein there are means for adjusting the angle of tilt of said bottom surface to facilitate sliding into said assembly corner.

4. The apparatus of claim 1,
   wherein the mounting means includes an inclined platform,
   wherein the cube holder is mounted on the platform so that said assembly corner is aligned with the path of travel of the crystals as they slide along said bottom surface toward the assembly corner.

5. The apparatus of claim 4,
   wherein there are means pivotally mounting the cube holder on the platform to allow said assembly corner to be aligned with said path.

6. The apparatus of claim 5,
   wherein means are provided for adjusting the angle of inclination of the platform.

7. The apparatus of claim 1,
   wherein there are means for guiding the crystals falling from the feeding means onto said bottom surface so as to facilitate landing of each crystal with one of its faces flat on said bottom surface.

8. An apparatus for making an integrated, tightly packed assembly of oriented synthetic crystals of diamond of predominantly cubic shape and of substantially the same size comprising:

a cube holder having a bottom surface and sides forming an assembly corner having the shape of a corner of a cube, the cube holder being mounted at an angle of tilt with the bottom surface sloping downwardly toward the assembly corner, a crystal feeder having a discharge outlet over the holder and from which crystals are fed onto the bottom surface so that each crystal lands in a stable position on the bottom surface with one of its faces lying flat against the bottom surface, and a vibrator in vibratory engagement with the cube holder so that at said angle of tilt, crystals lying on said bottom surface are caused by vibration of said bottom surface to slide along a path of travel toward the assembly corner and assemble in side-by-side contact with each other to form a two-dimensional array of crystals whose crystallographic directions are aligned and where the two-dimensional array of crystals has a common surface with a common crystallographic direction, wherein the apparatus includes an inclined platform, wherein the cube holder is mounted on the platform with said assembly corner aligned with the path of travel of the crystals as they are fed onto said bottom surface by the feeder, and wherein the cube holder is pivotally mounted on the platform to allow said assembly corner to be aligned with said path.

9. The apparatus of claim 8, wherein the position of the assembly corner is adjustable transversely of said path so as to align the path with the assembly corner.

10. The apparatus of claim 8, wherein the angle of tilt of said bottom surface is adjustable to facilitate sliding of the crystals into said assembly corner.

11. The apparatus of claim 8, wherein the angle of inclination of the platform is adjustable.

12. The apparatus of claim 8, wherein there is a funnel interposed the discharge of the feeder and the cube holder for guiding the crystals falling from the feeder onto said bottom surface so as to facilitate landing of each crystals with one of its faces flat on said bottom surface.

* * * * *